United States Patent [19]

Berman et al.

[11] Patent Number: 4,816,999

[45] Date of Patent: Mar. 28, 1989

[54] METHOD OF DETECTING CONSTANTS AND REMOVING REDUNDANT CONNECTIONS IN A LOGIC NETWORK

[75] Inventors: Charles L. Berman, New York; Daniel Brand, Croton-on-Hudson; Louise H. Trevillyan, Katonah, all of N.Y.

[73] Assignee: International Business Machines Corporation, Armonk, N.Y.

[21] Appl. No.: 52,672

[22] Filed: May 20, 1987

[51] Int. Cl.[4] .......................................... G06F 15/60
[52] U.S. Cl. .................................... 364/489; 364/488
[58] Field of Search .............................. 364/488–491, 364/300, 716, 578; 371/20, 23, 24; 307/441, 219

[56] References Cited

U.S. PATENT DOCUMENTS

| | | | |
|---|---|---|---|
| 4,306,286 | 12/1981 | Cocke et al. | 364/488 |
| 4,386,403 | 5/1983 | Hsieh et al. | 364/300 |
| 4,551,814 | 11/1985 | Moore et al. | 364/716 |
| 4,551,815 | 11/1985 | Moore et al. | 364/716 |
| 4,602,339 | 7/1986 | Aihara et al. | 364/490 |
| 4,635,218 | 1/1987 | Widdoes, Jr. | 371/20 |
| 4,696,006 | 9/1987 | Kawai | 371/20 |
| 4,703,435 | 10/1987 | Darringer et al. | 364/489 |
| 4,725,975 | 2/1988 | Sasaki | 364/491 |

Primary Examiner—Parshotam S. Lall
Assistant Examiner—V. N. Trans
Attorney, Agent, or Firm—Jack M. Arnold

[57] ABSTRACT

A method of reducing the number of connections in, and increasing the testability of, a logic network. This is accomplished by propagating global controlling information through a graphical representation of the logic network. Logically redundant connections are detected and removed by means of this information.

5 Claims, 11 Drawing Sheets

OVERVIEW

FIG.1 OVERVIEW

INITIALIZE CONTROLLING INFORMATION

REDUNDANCY IDENTITIES

FIG.7 PROPAGATE CONSTANTS

CONTROLLING
INFORMATION
PROPAGATION

METHOD OF DETECTING CONSTANTS AND REMOVING REDUNDANT CONNECTIONS IN A LOGIC NETWORK

BACKGROUND OF THE INVENTION

This invention is directed to logic design, and more particularly to a method of taking an original logic network configuration, and producing therefrom a new logic network configuration which has a reduced number of connections and improved testability.

As the complexity of processors has increased, the task of processor logic design has become more difficult. The designer may begin by designing a flow chart or other register-transfer level description to describe the intended operation of the processor, and the processor operation is then simulated from this description in order to ensure that a processor operating in accordance with the flow chart will provide the desired results. A logic implementation is then designed to achieve the operation described in the flow chart, and the resulting logic diagram and original flow chart specification are compared to ensure consistency. Finally, a physical layout is designed in accordance with the logic implementation.

The above process has become significantly more difficult and extraordinarily time consuming with the increasing complexity of the processors being designed. For example, each chip in the 3081 processor available from International Business Machines Corporation includes over 700 circuits capable of performing extremely complex functions.

The flow chart specification of such processor will be quite complex, and even a first attempt at logic diagram implementation will require a substantial amount of time. Further, with increasing processor complexity, the competing interest of gate count and timing constraints become increasingly difficult to satisfy. More particularly, a typical timing constraint may be that a signal must be provided from the output of register A to the input of register B within some predetermined period of time, and the designer may first propose a logic arrangement intended to satisfy this timing constraint while using a minimal number of gates in the circuit path between registers A and B. After timing analysis, however, it may be discovered that the timing constraint has not been satisfied, and the designer must then revise the arrangement of logic between the registers A and B, e.g., by using a larger number of gates to improve the processing speed in that area. Several iterations of design may be required before a logic design is obtained which indeed satisfies all timing constraints with the minimum gate count, and it is therefore not uncommon for the logic design to be quite costly in terms of engineering time.

In view of the above, there has been significant recent activity in the field of automatic logic synthesis. Early work centered on developing algorithms for translating a boolean function into a minimum 2-level network of boolean primitives, and extensions were developed for handling limited circuit fan-in and alternative cost functions. However, because these algorithms employ 2-level minimization, the time required to implement these algorithms increases exponentially with the number of circuits. The use of such algorithms therefore becomes impractical in designing large processors.

Other efforts have attempted to raise the level of specification, e.g., by beginning with behavioral specifications and producing technology-independent implementations at the level of boolean equations. However, the results of such techniques were usually more expensive than manual implementations and did not take advantage of the target technology. For example, the system described by T. D. Friedman et al, in "METHODS USED IN AN AUTOMATIC LOGIC DESIGN GENERATOR (ALERT)," IEEE Trans. Computers C-18, 593–614 (1969), produced implementation for an IBM 1800 processor which required 160% more gates than the manual design for that same processor. Several attempts have been made to produce more efficient logic and to give the designer more control over the implementation, e.g., as described by: H. Schorr, "TOWARD THE AUTOMATIC ANALYSIS AND SYNTHESIS OF DIGITAL SYSTEMS," Ph.D. Thesis, Princeton University, N.J., 1962; C. K. Mestenyi, "COMPUTER DESIGN LANGUAGE SIMULATION AND BOOLEAN TRANSLATION," Technical Report 68–72, Computer Science Department, University of Maryland, College Park, Md. 1968; F. J. Hill and G. R. Peterson, "DIGITAL SYSTEMS: HARDWARE ORGANIZATION AND CONTROL," John Wiley & Sons, Inc., N.Y., 1973. However, this control has resulted in specification language constraints, so that the specification is at a fairly low level and in closer correspondence with the implementation. This necessarily decreases the advantage of an automated approach, bringing it closer to a system for logic entry rather than logic synthesis.

Several tools have been developed to support the early part of the design cycle, e.g., as described in: M. Barbacci, "AUTOMATED EXPLORATION OF THE DESIGN SPACE FOR REGISTER TRANSFER SYSTEMS," Ph.D. Thesis, Carnegie-Mellon University, Pittsburgh, Pa., 1973; D. E. Thomas, "THE DESIGN AND ANALYSIS OF AN AUTOMATED DESIGN STYLE SELECTOR," Ph.D. Thesis, Carnegie-Mellon University, Pittsburgh, Pa., 1977; E. A. Snow, "AUTOMATION OF MODULE SET INDEPENDENT REGISTER-TRANSFER LEVEL DESIGN," Ph.D. Thesis, Carnegie-Mellon University, Pittsburgh, Pa., 1978; L. J. Hafer and A. C. Parker, "REGISTER-TRANSFER LEVEL DIGITAL DESIGN AUTOMATION: THE ALLOCATION PROCESS," Proceedings of the Fifteenth Design Automation Conference, Las Vegas, Nev., 1978, pp. 213–219; A. Parker, D. Thomas, D. Siewiorek, M. Barbacci, L. Hafer, G. Leive, and J. Kim, "THE CMU DESIGN AUTOMATION SYSTEM—AN EXAMPLE OF AUTOMATED DATA PATH DESIGN," Proceedings of the Sixteenth Design Automation Conference, Las Vegas, Nev., 1978, pp. 73–80. The technique described in the last-cited publication began with a functional description of a machine and produced and implementation in two technologies of the registers, register operators and their interconnections, but not the control logic to sequence the register transfers. For both TTL and CMOS implementations, however, the automated implementation required substantially more chip area than existing manual designs.

There has also been recent work in logic remapping, i.e., transforming existing implementations from one technology to another. S. Nakamura et al S. Nakamura, S. Murai, C. Tanaka, M. Terai, H. Fujiwara, and K. Kinoshita, "LORES-LOGIC REORGANIZATION SYSTEM," Proceedings of the Fifteenth Design Automation Conference, Las Vegas, Nev. 1978, pp. 250-260; describe a system which will help a designer translate an existing small or medium-scale integration. However, remapping usually involves one-to-one substitution of new technology primitives for old technology primitives, and this often fails to take advantage of simplification which may be available at a higher technology-independent level.

U.S. patent application, Ser. No. 631,364, filed Jul. 1984, now U.S. Pat. No. 4,703,435 entitled, "LOGIC SYNTHESIZER" which patent is assigned to the assignee of the present invention sets forth a logic synthesis method in which a register-transfer level flowchart specification is translated in a straightforward manner into a simple AND/OR logic implementation. After expanding the logic implementation to elementary representation and then applying textbook simplifications, the simplified AND/OR implementation is translated to a NAND or NOR implementation, depending on the target technology. The NAND or NOR implementation is then simplified by applying a sequence of simplification transformations which achieve satisfactory results, with the transformation sequence being modified to achieve "normal," "fast" or "small" logic designs. After simplification at the NAND/NOR level, the logic implementation is then translated to the target technology and further simplified. The result is an interconnection of the primitives of the target technology in a language from which automated logic diagrams can be produced in a known manner, and which can be submitted to existing programs for automated placement and wiring and chip fabrication.

U.S. Patent application, Ser. No. 07,028,277, filed Mar. 20, 1987, entitled "A Method To Efficiently Reduce The Number of Connections In A Circuit" which application is assigned to the assignee of the present invention sets forth a method of taking a provided logical design or an original circuit implementation as set forth in U.S. Pat. No. 4,703,435 set forth above, and producing therefrom a new circuit implementation which is the functional equivalent of, and contains fewer connections than, the original circuit implementation. This is the result of approaching connection minimization globally rather than utilizing local transformation as in the prior art. For example, a semiconductor chip such as a master slice chip which is connected in a given circuit configuration has the number of connections between elements minimized. Stated another way, the idea is to minimize connections between terminals or nodes on the master slice chip. Each of n signals is processed in a circuit configuration sequentially. For each such signal in the given circuit a derived graph is constructed. The minimal cut of the derived graph is found, and this cut is utilized to optimize the circuit. The next signal is processed in the optimized circuit, and this procedure is repeated until all n signals have been processed. The resulting optimized circuit is the functional equivalent of the original circuit, but has fewer connections.

According to the present invention a method is set forth for reducing the number of connections in, and increasing the testability of, a logic network. This is accomplished by propagating global controlling information through a graphical representation of the logic network. Logically redundant connections are detected by means of the controlling information.

DISCLOSURE OF THE INVENTION

A method is disclosed for reducing the number of connections in, and increasing the testability of, a logic circuit. Global controlling information is computed for each signal in the circuit. Redundancy identities for each signal are computed, and constants are propagated for the signals. Logically redundant connections are detected and removed as a result of the computations.

BEST MODE FOR CARRYING OUT THE INVENTION

Figure 1:
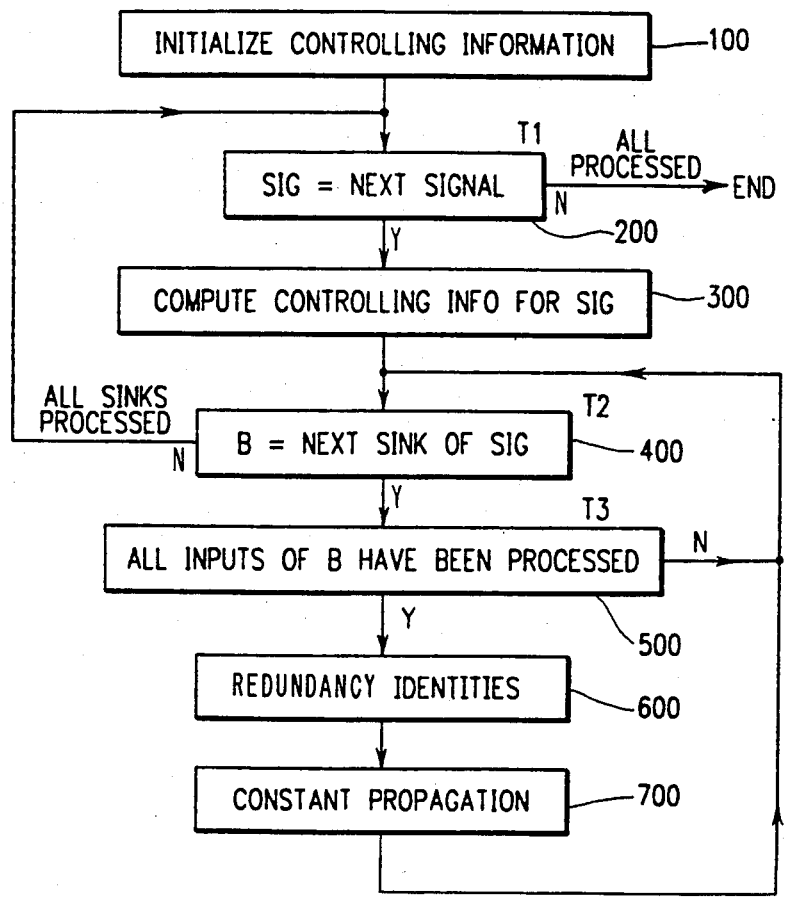
FIG. 1 is an overview flow chart of the method for removing redundant connections according to the invention.

A method is described for detecting the redundant connections and reducing the number of connections in a logic network, while increasing the testability of the logic. This is accomplished by means of propagating global controlling information through a graphical representation of the circuit and detecting logically redundant connections by means of this information. This is accomplished in the practice of the invention by means of a properly programmed computer system such as the IBM System/370 data processing system, as defined by the "System/370 Principles of Operation", Form No. GA22-7000. It is to be appreciated, however, that the invention may be practiced on any general purpose computer or machine.

For purposes of description of the invention, a connection in a circuit is defined as a wire attached to an input pin of some component of the circuit; each wire may have many connections in the logic. The area of a circuit is directly proportional to the number of connections in the circuit, and the speed and testability of the circuit are inversely related to the number of connections. Since the goal of logic design is to make the area small and the speed and testability high, it is desirable to minimize the number of connections in a logic circuit. The purpose of the invention is not to achieve the fewest number of connections, but rather the fewest number of connections which can be tested.

One way connections can be reduced is by detecting logical redundancy in the circuit. A connection is logically redundant if it does not influence the value of any observable point in the logic (observable points are memory elements or primary outputs). Depending upon the kind of redundancy, the connection can either be removed or the logic function which it feeds can be deleted from the circuit. Unfortunately, the problem of removing logical redundancy is known to be computationally intractable, so it is necessary to devise heuristics or approximate methods to perform this function.

In the following, a method of computing global information about a circuit and the use of the information in removing logical redundancies is described. The information computed gives some relationships between a signal (wire) in the circuit and a set of other signals in the circuit. The terms ONE and ZERO will be used interchangeably with the terms 1 and 0, respectively. Specifically, for each signal, s, an approximation to four sets is computed:

C00(s)—if any signal in this set is 0, then s must be 0.
C01(s)—if any signal in this set is 0, then s must be 1.
C10(s)—if any signal in this set is 1, then s must be 0.
C11(s)—if any signal in this set is 1, then s must be 1.

This information can be used to detect the logical redundancies both by static application of redundancy identities and by a dynamic process of pseudo-constant propagation in which the global information is used as part of a set of assumptions about the logic.

STATIC APPLICATION

The idea of static application is to perform mathematical manipulations of the sets in order to detect redundancy. No "pattern matching" or traversal of the surrounding logic is necessary because the information needed has already been collected in the global sets. For example, if the intersection of C00(s) with C10(s) is not null, then it is deduced that s itself must be 0. The reasoning for this is as follows:

1. Suppose that a signal x is in both C00(s) and C10(s).
2. Signal x in C00(s) means that x=0 forces s to be 0.
3. Signal x in C10(s) means that x=1 forces s to be 0.
4. The only possible values for x are 0 and 1.
5. Signal s must be 0.

The intent is to show that global information can be used to detect logical redundancies in a static fashion, so the examples given here should be considered to be illustrations of the method and are by no means an exhaustive list of the ways the information can be used.

DYNAMIC APPLICATION

In this case, the sets themselves are used as part of a set of assumptions and the logic is dynamically searched in such a way as to try to find a contradiction to the assumptions. Whenever the assumptions are contradicted, a logical redundancy is found.

Specifically, the method chosen is to perform a "pseudo" constant propagation. In NOR logic, a connection c to a box B can be observed only if it can be set to ONE while all other input connections to box B are left at 0. In order to use "pseudo" constant propagation, it is determined from the sets described above, the implication of fact that all inputs to B other than c are 0. This yields a set, W1, of signals all of which must be 1 and another set, W0, of signals all of which must be 0. Conceptually, each of the signals in W1 is set to 1, each of the signals in W0 is set to 0, and the constants are propagated through the logic. After the propagation phase, the value of c at B is examined. There are two possibilities: c is a constant or c is not defined. If c is a constant, the connection of c at B can be replaced by the constant. If c is not defined, no contradiction has been found and the connection at B must remain.

In a similar vein, it can be assumed that all of the inputs to B except for the i-th position and c are ZERO. The i-th position is assumed to be 1. Again, the implications of these values are collected in W0 and W1 sets and constant propagation is performed. If the value on c is ONE, position i can be replaced by ZERO.

In the method described the signals are not actually set to the values from W0 and W1 since this would destroy the logic. Instead, the logical functions are interpreted with respect to W0 and W1 in order to find the value at c.

The algorithms described here are interspersed by a true constant propagation phase which takes care of exploiting the effects of the newly connected constants. IN NOR logic, replacing a connection by a ONE is the same as changing the output of the NOR to a ZERO. Replacing a connection by ZERO is the same as disconnecting the signal except in cases in which there is only one input to the NOR. In that case, replacing by a ZERO is the same as replacing the output of the NOR with a ONE. In the cases where the output is changed, these constants are also propagated forward through the logic in a similar manner.

Finally, it is most efficient to apply these methods in a left-to-right order over the logic so that the redundancies are removed before the global information is computed. This directed approach takes advantage of forward propagation of logic and avoids including redundant signals in the global information as it is computed.

DATA STRUCTURES

In this procedure, a network or logic circuit is viewed as a directed graph. The nodes of the graph represent primitive functions of the logic, that is the logic devices, and the edges represent the data or wire connections between the nodes. For purposes of description, the nodes are called "boxes" and the edges are called "signals". The input and output edges to the boxes are ordered so that they may be referred to as the first, second, etc. input and output to a box. The term "sink of a signal" is used to refer to a box to which the signal is input.

For each signal, s, in the logic (or edge in the logic graph), an approximation to the following information is computed.

$C00(s) = \{t \mid t=0 \text{ implies } s=0\}$
$C01(s) = \{t \mid t=0 \text{ implies } s=1\}$
$C10(s) = \{t \mid t=1 \text{ implies } s=0\}$
$C11(s) = \{t \mid t=1 \text{ implies } s=1\}$ The CIJ sets are called controlling sets because a certain value (I) on any signal in CIJ controls the value of signal s (to J).

Every signal in the logic is arbitrarily assigned a number ranging from 1 to the number of signals in the logic graph. For purposes of description, it is assumed that the signal named j has the same name as its source, i.e. signal "j" is produced by node "j". The first input to node "j" is referred to as j.in.1, and similarly for other inputs. Conceptually, each of the controlling sets is represented as a vector of bits such that a ONE in position i of the vector indicates that the signal corresponding to number i is in the set. A ZERO means that the corresponding signal is not in the set. In fact, each of these sets is stored as a sparse array in order to conserve memory. When referring to these sets and operations on them, either a set or bit vector notation and terminology is used interchangeably, according to whichever is more convenient.

The final important data structure in the procedure is used for levelizing the logic graph. For each box in the logic, a counter is used to determine the point at which the outputs of the box can be processed. The other levelizing data structure is a stack which contains the identities of the signals that are available for processing.

ALGORITHM OVERVIEW

The algorithm is described as though the logic consists only of NOR circuits, however this is not a limitation of the algorithm.

The Overview flow chart of FIG. 1 shows how the method proceeds at the highest level. The method processes the signals in the circuits in a breadth first topological order manner, beginning at signals which are primary inputs or which are the outputs of nodes which are not NORs. This order is important because the output value depends on the input values. It also avoids iteration on the logic since redundant connections are removed from the box input before the output vectors are computed and guarantees that when a signal is chosen in test (T1), described below all inputs to that signal have been processed.

The algorithm comprises five parts which are shown, in conjunction with three tests which are also performed, in the overview flow chart of FIG. 1. Controlling information is initialized for each signal s in the logic circuit as indicated at 100. A first test (T1) is performed at 200 to test for each signal in the circuit until all signals have been processed, and controlling information for each signal is computed as indicated at 300. At 400, a second test T2 is performed to compute B the next sink of the signal under consideration, and a third test T3 is performed at 500 to determine if all inputs of B have been processed. Redundancy identities are computed at 600 and constant propagation is performed at 700. Constant propagation includes applying constant propagation routines, propagating constants and computing global controlling information all of which are discussed in more detail below.

The five parts of the algorithm are as follows:

1. INITIALIZE CONTROLLING INFORMATION

This section of the algorithm, which was indicated at 100 in FIG. 1, makes the following assignments for every signal, s, which is either a primary input or which is the output of a node which is not a NOR: $C00(s) = C11(s) = \{s\}$ and $C01(s) = C10(s) = \phi$, where $\phi$ means the set has no members.

Figure 2:
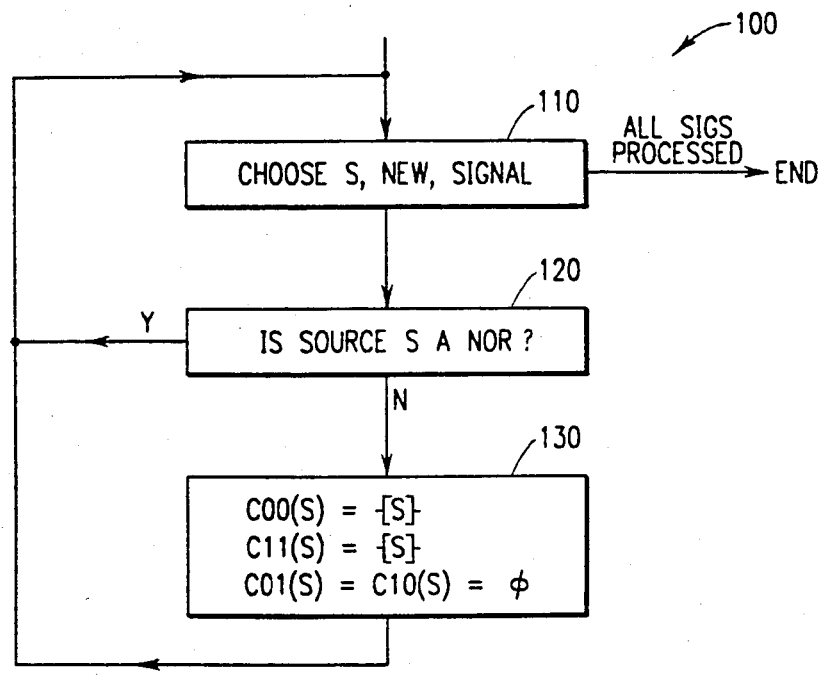
FIG. 2 is a flow chart of the "initialize controlling information" function which is shown generally in FIG. 1.

Referring to FIG. 2, at 110 each signal s is processed until all such signals in the network have been processed. Then at 120 it is determined whether or not a source s is a NOR, and at 130, for each output of a node which is not a NOR the indicated assignment is made.

2. APPLY REDUNDANCY IDENTITIES

There are three types of redundancy which the described method currently discovers, and which was indicated at 600 in FIG. 1. This does not include all possible redundancies detectable by the use of the global controlling information and is not an inherent limitation of the method. These types of redundancy were chosen based on common situations that were observed in actual logic.

Figure 3:
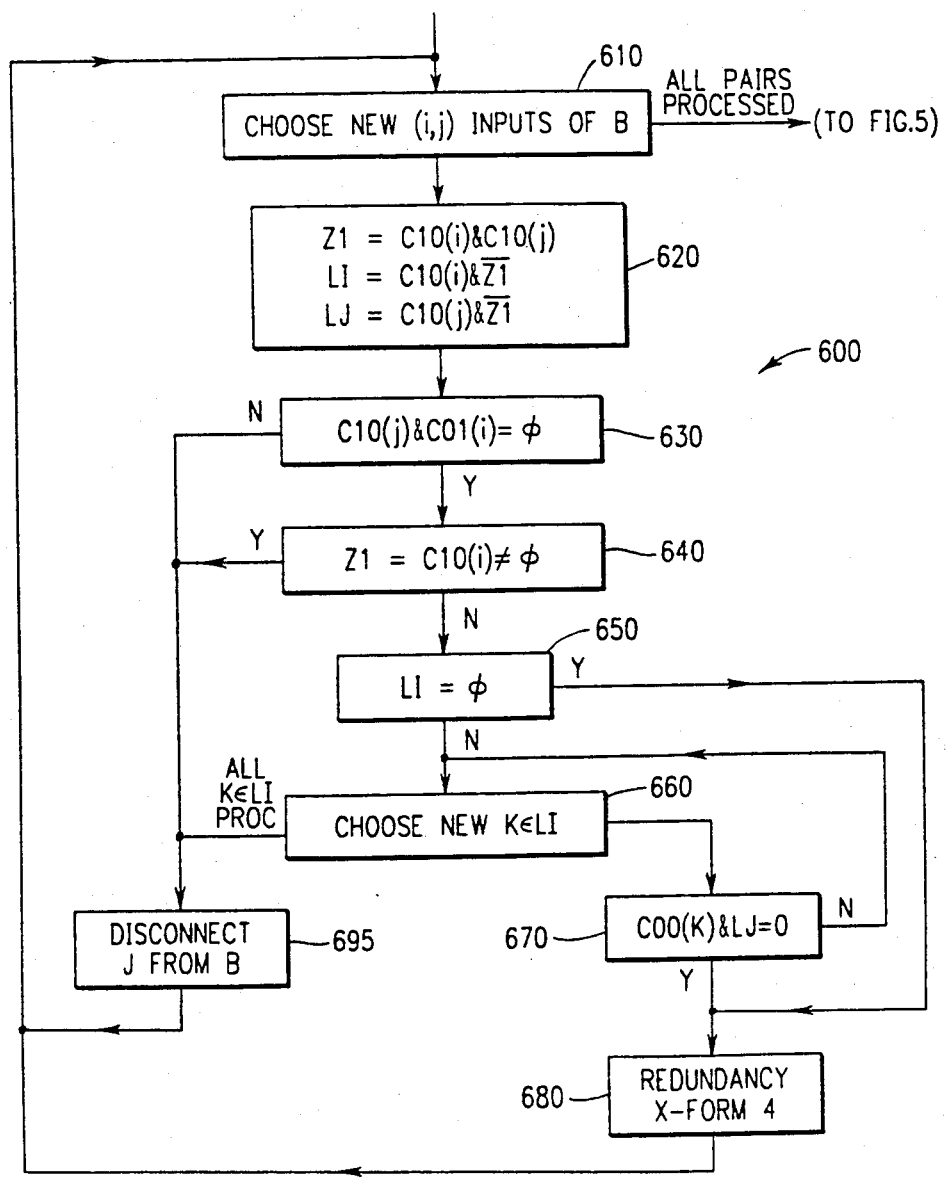
FIGS. 3 and 4 are flow charts of the "redundancy identities" function which is shown generally in FIG. 1.

Refer now to FIG. 3 for the details of the redundancy identities 600. All of these simplifications begin by choosing an ordered pair, (i,j), of input signals to a box B and examining the relationships between their various controlling sets as indicated at 610.

The actual steps of the method used here involves two steps. First, as indicated at 620, compute the following information:

$Z1 = C10(i)$ & $C10(j)$ $LI = C10(i)$ & $-Z1$ $LJ = C10(j)$ & $-Z1$

Z1 is the set of signals that are included in both $C10(i)$ and $C10(j)$, so if signal $s \in Z1$, then $s=1 \rightarrow i=0$ and $j=0$.

The L sets are what is left when the common signals are removed. Thus, if $s \in LI$, then $s=1 \rightarrow i=0$ but $s=1$ does not imply that j is 0.

Then this is used for the following simplifications at various points in the program.

As tested at 630, if $C10(j)$ & $C01(i) \neq \phi$ then the connection of j at B is redundant.

As tested at 640, if $Z1 = C10(i)$ and $Z1 \neq \phi$, then the connection of j at B is redundant.

As tested at 650 and 660 if $LI \neq \phi$ and for all k in LI, the intersection of $C00(k)$ and LJ is $\neq \phi$, then the connection of j at B is redundant.

The above simplifications limit their scope to one level of logic behind B. There is no limit to how far optimizations can look behind B and included is one that does go farther back. Optimizations which involve more levels of logic have not been included because as the simplifications consider more of the logic, they become more complex.

The final simplification of this section goes back one level further from box B as indicated at 680. Details of 680 are given in the flowchart of FIG. 4. In order to avoid duplication of logic, this simplification is applied only when signal j has exactly one sink as indicated at 681. At 682 Q1 and Q2 are set to 1. First as shown at 683 and 684, Q1 is computed which is the intersection of $C00(s)$ for all s that are in LI and which are inputs to the source box of signal i. Similarly, at 683 and 684 Q2 is computed which is the intersection of $C10(s)$ for all s that are in LI and which are inputs to the source box of signal i. Next at 685 examine each of the inputs, t, to the source of signal j which are also in LJ as tested at 686 and for which $C11(t)$ & $C10(i)$ is $\neq \phi$ as 687 and 688. If Q1 & $C10(t)$ is $\neq \phi$ or if Q2 & $C00(t)$ is $\neq \phi$, at tested at 689 and 690, then the connection of t at the source box of signal j is redundant as indicated at 691.

The above four simplifications are illustrated in examples 1 to 4, which are set forth later relative to FIGS. 9-12. A detailed simulation of the method on these examples is given following part 5.

The constant propagation routine which is indicated generally at 700 of FIG. 1 comprises parts 3, 4 and 5 of the algorithm, the details of which are set forth below. Part 3 is the "apply constant propagation routines; part 4 is the "propagate constants routine"; and part 5 is the "compute global controlling information routine".

3. APPLY CONSTANT PROPAGATION ROUTINES

Figure 5:
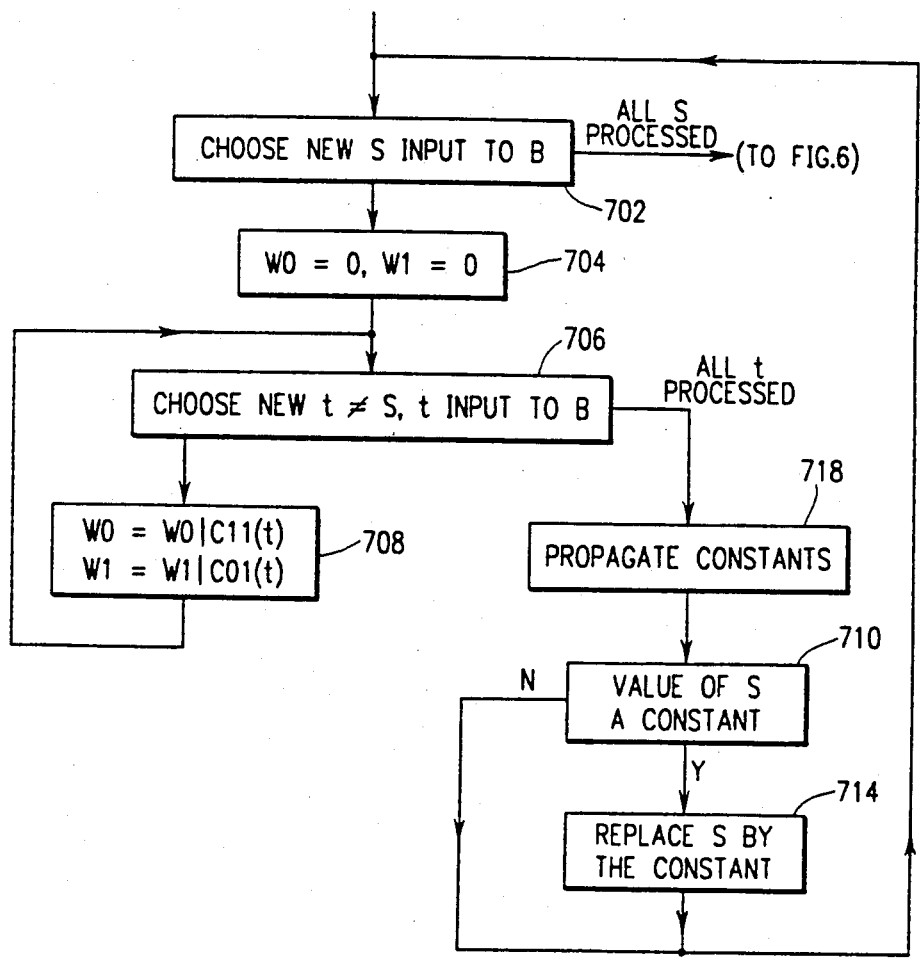
FIGS. 5-7 are flow charts of the "constant propagation" function which is shown generally in FIG. 1.
Figure 6:
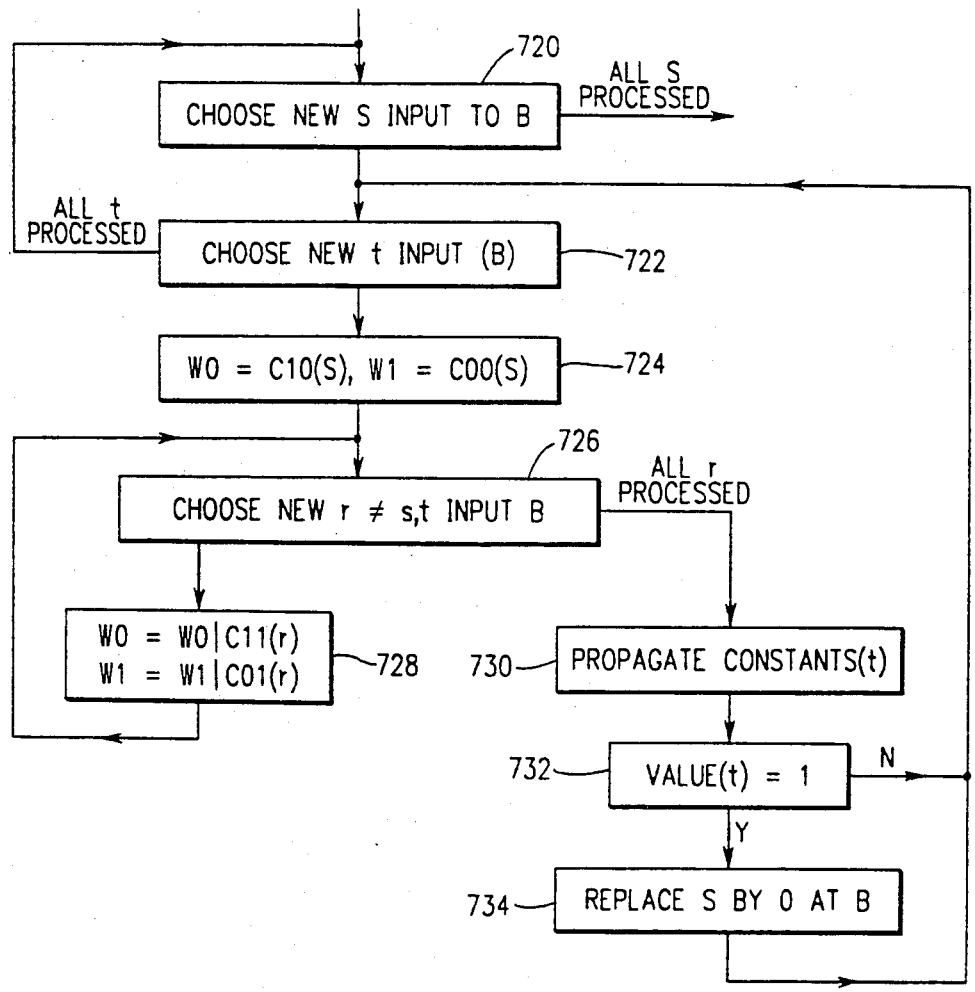

In this procedure, as shown in FIGS. 5 and 6, each connection in the logic is tested for redundancies. For clarity of understanding, FIGS. 5 and 6 show each connection being visited a number of times. In fact, a more efficient approach is to propagate vectors of constants and to test each connection only once.

The fundamental idea in this procedure is to test a connection by ascertaining if the values of signals on other connections to the box determine the value at the chosen connection. As shown in FIGS. 5 and 6, a signal s is tested on input k by assuming that all other input positions on box B have a value 0. As shown in 706 and 707, for each of the other input signals, t, assumed to be zero, every signal in $C11(t)$ must be 0, since if x in $C11(t)$ is 1, then s must be 1. Likewise, every signal in $C01(t)$ must be 1. W0 is computed, the set of signals that must be 0 under the assumptions by taking the union (logical OR) of the C11 sets. Similarly, the set W1 of signals that must be 1 are computed by ORing the C01 sets. Next, at 718 "Propagate Constants" procedure (FIG. 5) is applied at s with respect to the W0 and W1 sets. The result of constant propagation shows that s is a constant or that s is undefined. S is tested at 710. If it is a constant, its connection at B can be replaced by that constant as shown in 714. If s is undefined, no action is taken.

In FIG. 6 it is assumed that signal s is 1, and all other inputs to B are zero except signal t. Again, the W0 and W1 sets are formed and constants are propagated. First, signal s is chosen in 720 and t is chosen in 722. In 724, the W0 set is initialized to the signals that must be 0 when s is 1 and W1 is initialized to the signals that must be 1 when s is 1. The remainder of inputs to B must be 0, and the loop at 726 and 728 collects those implications into W0 and W1. When all have been processed, the constants are propagated (FIG. 7) and a t value is returned. At 732, the value for t is tested and, if it is 1, s at B is replaced by 0 at 734.

If the value is a 1, the connection at B.IN.i is replaced by the constant 0.

4. PROPAGATE CONSTANTS

Figure 7:
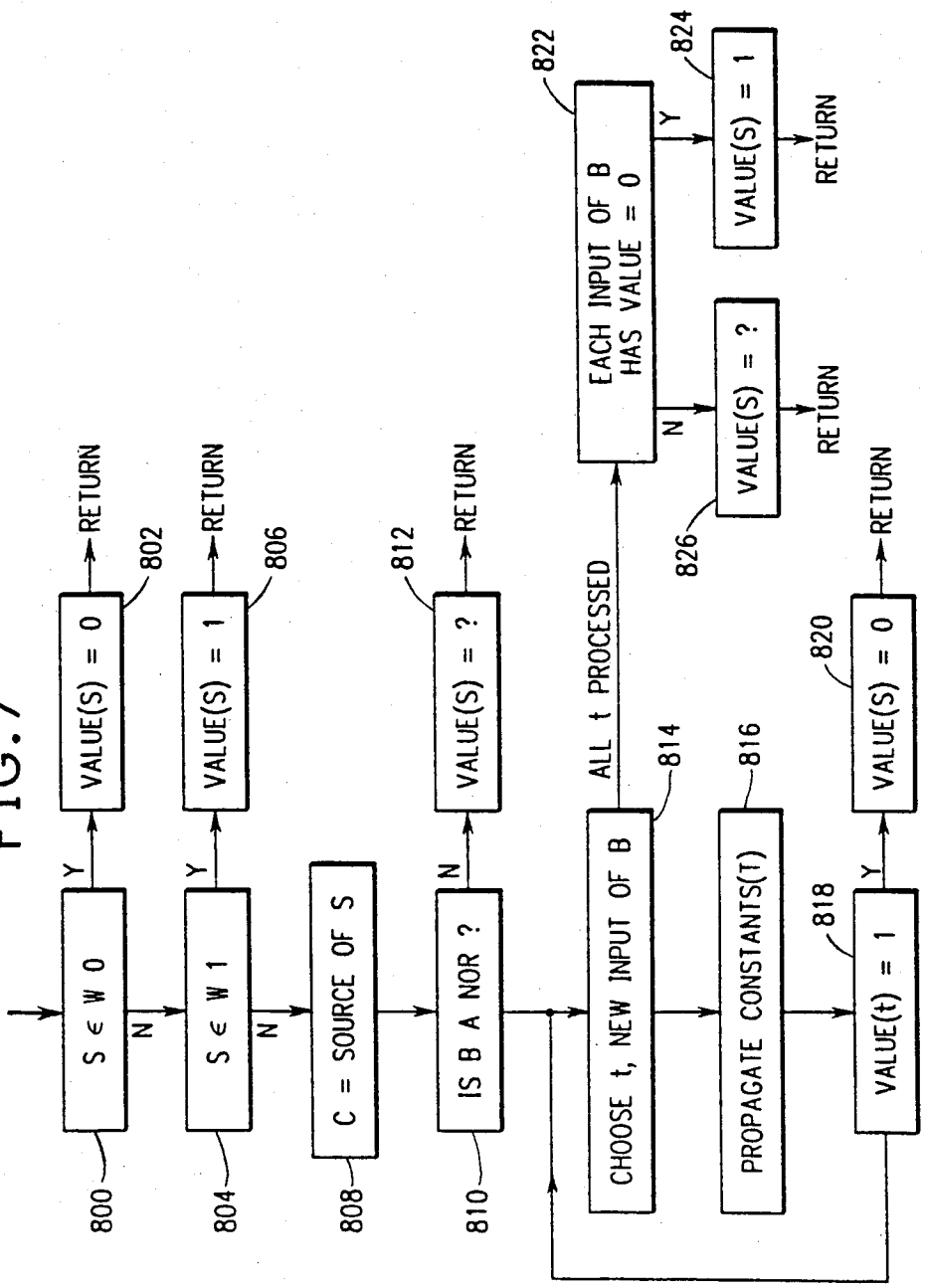

The "propagate constants" routine shown in FIG. 7 takes as input a signal, s, and uses two sets, W0 and W1. The set W0 contains those signals whose value is assumed to be 0 for the computation in question, and the set W1 contains those signals assumed to be 1. The procedure determines whether signals, s, is forced to have a particular value by the signals in W0 and W1.

Figure 13:
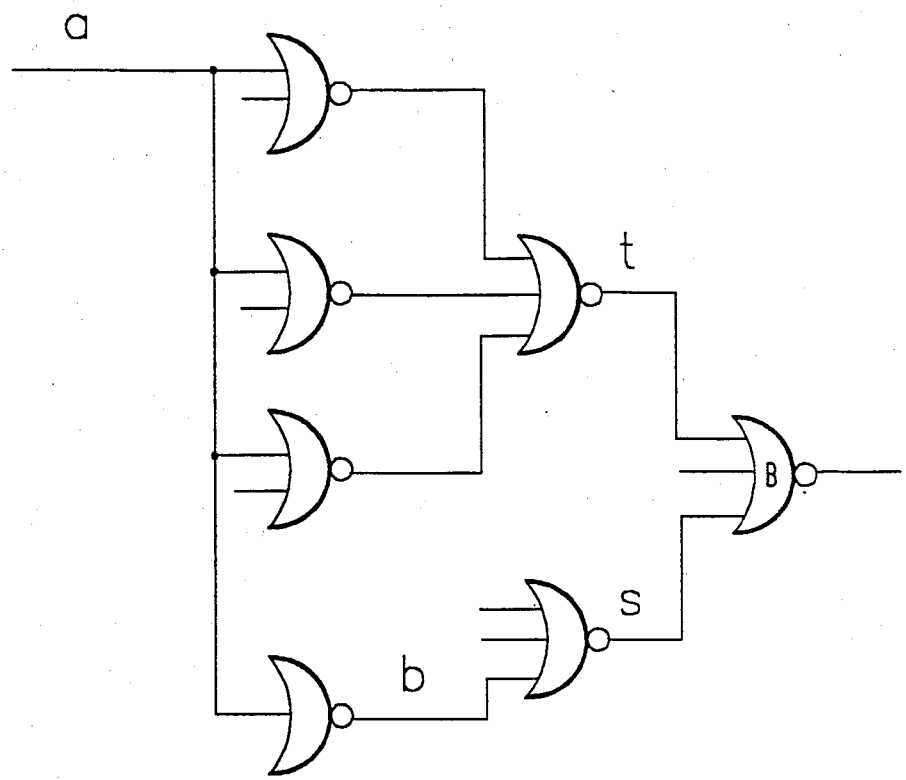

The procedure is as follows. Signal s is a constant 0 if it is in W0 (800 and 832), and a constant 1 if it is in W1 (804 and 806), and is undefined if it is computed by a box that is not a NOR (808 and 810). If none of these conditions hold, then the procedure must be invoked recursively on the inputs to the box B that computes s. After the recursive computation, all of the inputs to B will be known as either 0, 1, or undefined, and the definition of NOR is used to determine the result on signal s:

s is a constant 0 if any input to B is a 1 (818 and 820)
s is a constant 1 if all of the inputs to B are (822 and 824) constant zeroes,
s is undefined (826) if none of the inputs to B are ONES and at least one of the inputs of B is undefined. Example 5 as set forth with respect to FIG. 13 illustrates the action of this simplification, as will be explained in more detail subsequently.

5. COMPUTE GLOBAL CONTROLLING INFORMATION

At this point in the procedure, all data on the inputs to box B are known and any redundant connections detectable by this procedure have been processed. The global information for signal s, the output of NOR box B, is now computed by first initializing $C00(s)$ and $C10(s)$ to all ZEROES, $C01(s)$ and $C11(s)$ to all ONES as shown in 902, then each input of B is chosen at 904 and at 906. The following operations are performed:

$C00(s) = C00(s) \cup C01(t)$
$C01(s) = C01(s) \cap C00(t)$
$C10(s) = C10(s) \cup C11(t)$
$C11(s) = C11(s) \cap C10(t)$ Finally, s is added to the $C00(s)$ and $C11(s)$ sets at 908.

These definitions of the controlling vectors follow directly from the definition of a NOR. Since a 1 into a NOR forces the output value to 0, any signal that controls an input to a NOR to a 1 will control the output of the NOR to a 0. Specifically, if t is an input to B and x is in $C01(t)$, then x will be in $C00(s)$, as shown in the equation above.

Again, by the definition of NOR, all of the values of the inputs must be 0 to force the output to a 1. Therefore, the equation for the C01 and C11 vectors contain an AND function on the inputs of B rather than the OR that resulted in the "force to ZERO" conditions in C00 and C10.

The values for outputs of non-NORs are computed differently as set forth below:
$C00(s) = \{s\}$
$C01(s) = \phi$
$C10(s) = \phi$
$C11(s) = \{s\}$ After the vectors have been computed, the procedure checks for constants and identities using the following facts:

(910–912) If $C10(s) \,\&\, C00(s) \neq 0$, then replace s by 0).
(914–916) If $C11(s) \,\&\, C01(s) \neq 0$, then replace s by 1.
(918–920) If position j of $(C11(s) \,\&\, C00(s)) \neq 0$ and $s \neq j$, then replace s by j.
(922–924) If position j of $(C10(s) \,\&\, C01(s)) \neq 0$, then replace s by $-j$.

The final simplification is completed only if s is not already the output of an inverter of j.

An example of the first simplification is given in Example 6 in the "Detailed Simulation" section that follows. The other simplifications produce similar results.

DETAILED SIMULATION

This section contains a detailed simulation of the described method relative to six specific examples.

Figure 9:
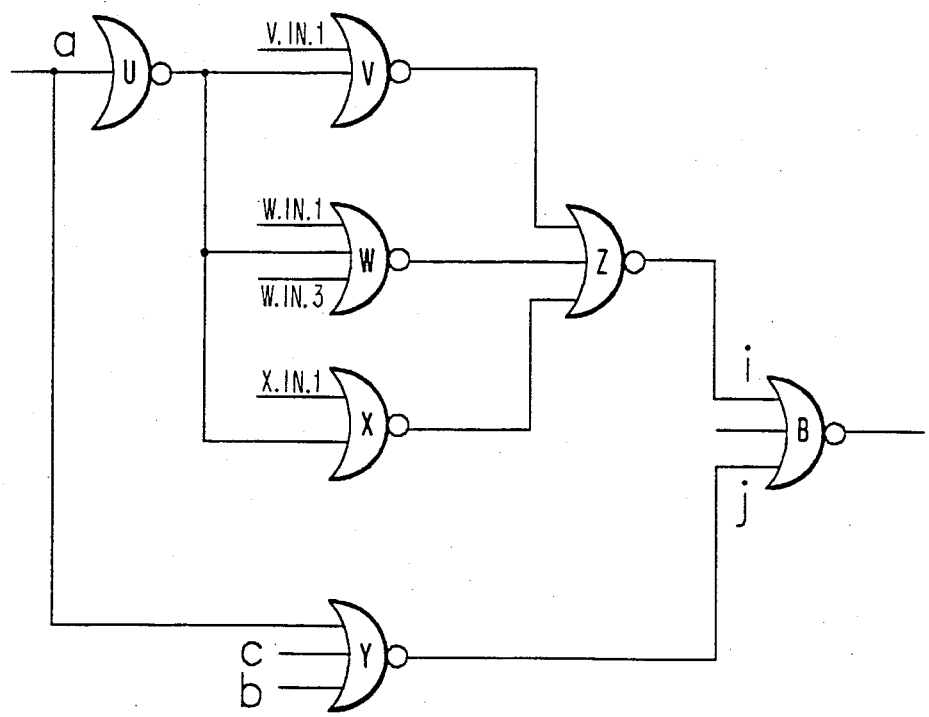
FIGS. 9-14 are schematic diagrams of logic circuits which have their redundant connections detected and removed according to the method of the invention.

Example 1:
Refer to FIG. 9, which is the logic network under consideration, and where it is assumed that a, b and c are not the outputs of NORs. Also, assume that V.IN.1, W.IN.1, W.IN.3, and X.IN.1 are processed and all controlling information is available. It is seen that the precise information for these signals does not effect the results in this case.

Begin in 100 of FIG. 1 by assigning values to C00, C01, C10, and C11 of a, b, and c. At T1 the test indicated at 200 of FIG. 1, assume SIG=a. Then flow through 300 as a is not the output of a NOR. At T2, the test indicated at 400, first choose B=10 U. Then go on to 600 since a, the only input of U, has been processed as tested at 500. 600 and 700 have no effect since U has only 1 input. Return to 00 where B=Y is chosen. Here all inputs of Y have not been processed so proceed to T2 at 400, then T1 at 200. Next proceed to process b and c as above. During the processing of c, when arriving at T3 at 500 with B=Y, it is found that all inputs of B have been processed so continue to 600 to determine redundancy identities.

Refer now to FIG. 3 for the details of determining the redundancy identities. In 610, the first pair may be (a,c). In 620 it is found that $Z1 = \phi$ so $LI = C10(a) = \phi$ and $LJ = \phi$. Then proceed consecutively to 630, to 640, to 650, and to 680. Once in 680, proceed to FIG. 4 for the details and go consecutively to 681, then to 682, then to 683, then to 685 and exit since j (=c) has no inputs. Proceed next to FIG. 5 and 702 where possibly s=c. Going around the loop comprised of 706 and 708 yields $W0 = \{a,b\}$ and $W1 = \phi$. Calling propagate constants at 718, 710, 712, 714 and 716 on the connection of c at B yields value=? and a return is made to 702. Similarly for the other choices of inputs to B, the propagate constants routine of FIGS. 5 and 6 have no effect.

Each example is designed to illustrate a particular part of the method and from now on a detailed simulation is given only for the parts which have an effect. Particular attention is payed to FIG. 8, "controlling information propagation", since this is vital to all the optimizations.

Figure 8:
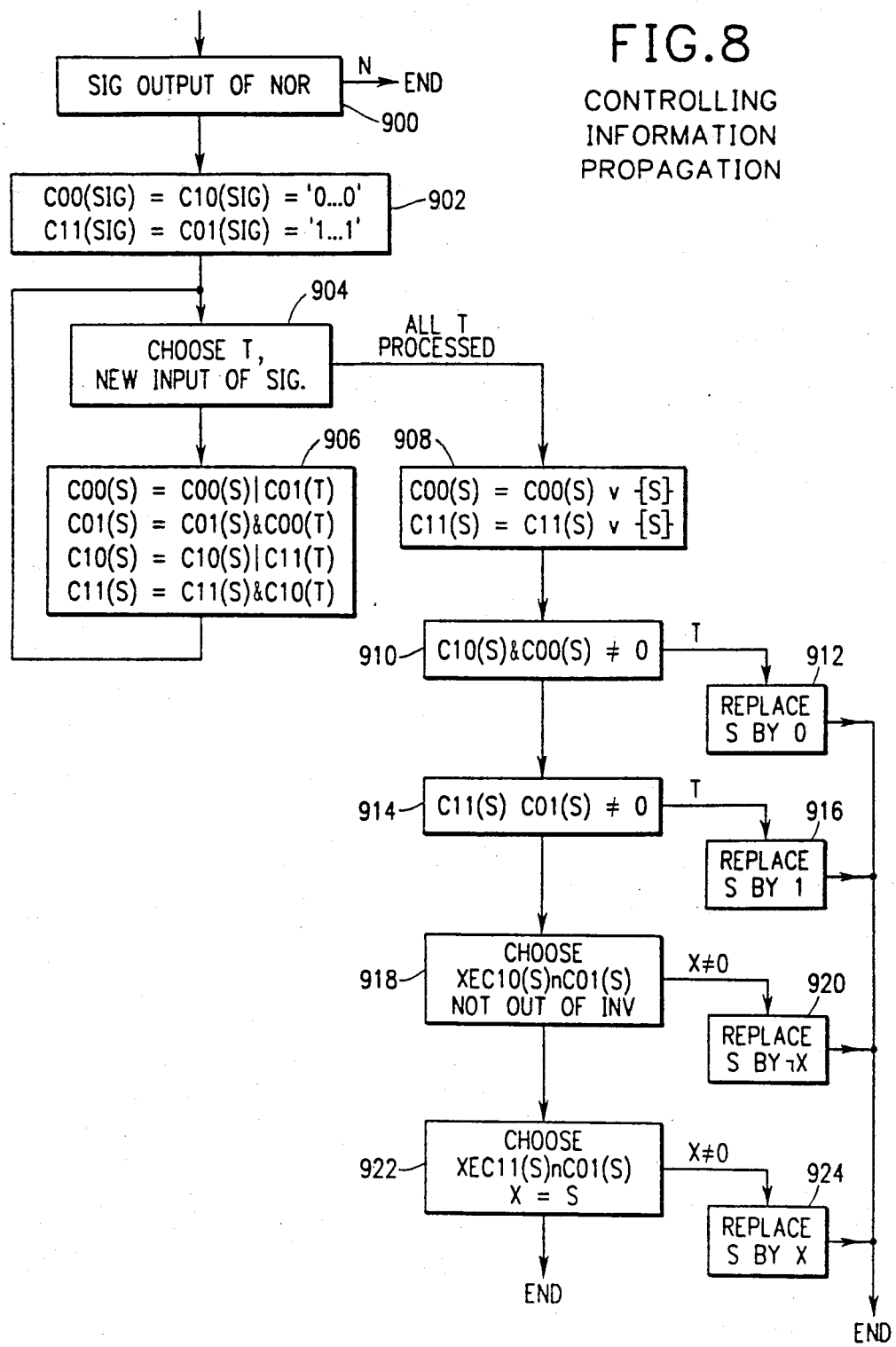
FIG. 8 is a flow chart of the "controlling information propagation" function which is shown generally in FIG. 1.

In this example 1, it is assumed FIG. 8 is entered at 900 with SIG=Y.OUT. Next go through 902 and 904 choosing T=a, at 906 C00(SIG)=$\phi$, C01(SIG)={a}, C10(SIG)={a}, and C11 (SIG)=$\phi$. Then return to 904 where T=b. Next at 906 C00 and C11 are unchanged while C01(SIG)=$\phi$ and C10 (SIG)={a,b}. Return to 904 where T=c and to 906 where only C10 changes, this time to C10 (SIG)={a,b,c}. Finally, at 908 set C00(SIG)=C11(SIG)={Y.OUT (=j)}. Then flow out leaving SIG in the tests at the end of FIG. 8.

When 900 is entered with SIG=U.OUT, an exit is made with C00(U.OUT)=C11(U.OUT)={U.OUT}, and C10(U.OUT)=C01(U.OUT)={a}.

Similarly, after 908 with SIG=V.OUT it is found that C00(V.OUT)=a, V.OUT,...}, C01(V.OUT)=$\phi$, C10(V.OUT)={U.OUT}, and C11(V.OUT)={V.OUT}. The results with SIG=W.OUT and X.OUT are analogous.

When 900 is entered with SIG=Z.OUT (=i) at 904 T=V.OUT might be chosen. At 906 set C00(i)=$\phi$, C01(i)={a, V.OUT}, C10(i)={V.OUT}, and C11(i)={U.OUT}. Then return to 904 and choose T=W.OUT. At 906 set C00(i)=$\phi$, C01(i)={a, . . .}, C10(i)={V.OUT,W.OUT}, and C11(i)={U.OUT}. Finally, after another iteration this time with T=X.OUT, the result is C00(i) =$\phi$, C01(i)={a, . . . }, C10(i)={$V.OUT, W.OUT, X.OUT$}, and C11 (i)={$U.OUT$}

Continuing the simulation, with reference to FIG. 1, assume the flow is to where B=B is set. At test T3 at 500 assume all inputs of B have been processed and continue to 600. Referring to FIG. 3, at 610 choose i=B.IN.1 and j=B.IN.3 as labelled in example I. The values computed in 620 and 630 are displayed below. The numbers in parentheses indicate where the parameters are computed.

|  | C10(j) = a,b,c |
|---|---|
|  | C01(i) = a |
| (630) | C10(j) & C01(i) = a |
| (695) | j is redundant at B |

Proceed next to 695 where j is disconnected from B.

Figure 10:
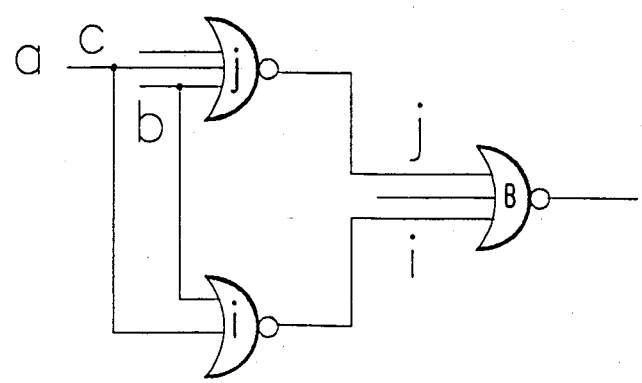

Example 2:

Refer to FIG. 10, which is the logic network under consideration, and FIG. 3 for redundancy identities. The necessary controlling information and the intermediate computations are set forth below. Note that at 630 of FIG. 3 the Y exit is taken to 640 where j is found to be redundant at B. The numbers in parentheses indicate where the parameters are computed.

|  | C10(i) = a,b; C01(i) = null |
|---|---|
|  | C10(j) = a,b,c |
| (620) | Z1 = a,b |
|  | Z1 = C10(i) |
| (640) | j is redundant at B |

Figure 11:
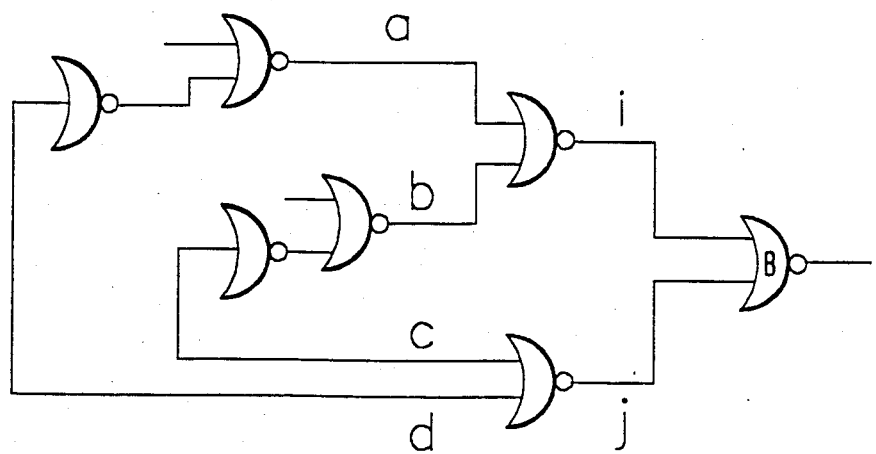

Example 3:

Refer to FIG. 11, which is the logic circuit under consideration, and FIG. 3 for redundancy identities. The numbers in parenthesis indicate where the parameters are computed. On each iteration of the loop 660 and 670 it is found that C00(k) and LJ$\neq$0 so j can be disconnected from B.

|  | C10(i) = a,b; C00(a) = a,d |
|---|---|
|  | C10(j) = c,d; C00(b) = b,c |
| (620) | Z1 = null |
| (620) | LI = a,b |
| (620) | LJ = c,d |
| (670) | C00(a) and LJ = d |
| (670) | C00(b) and LJ = c |
| (660–695) | j is redundant at B |

Figure 4:
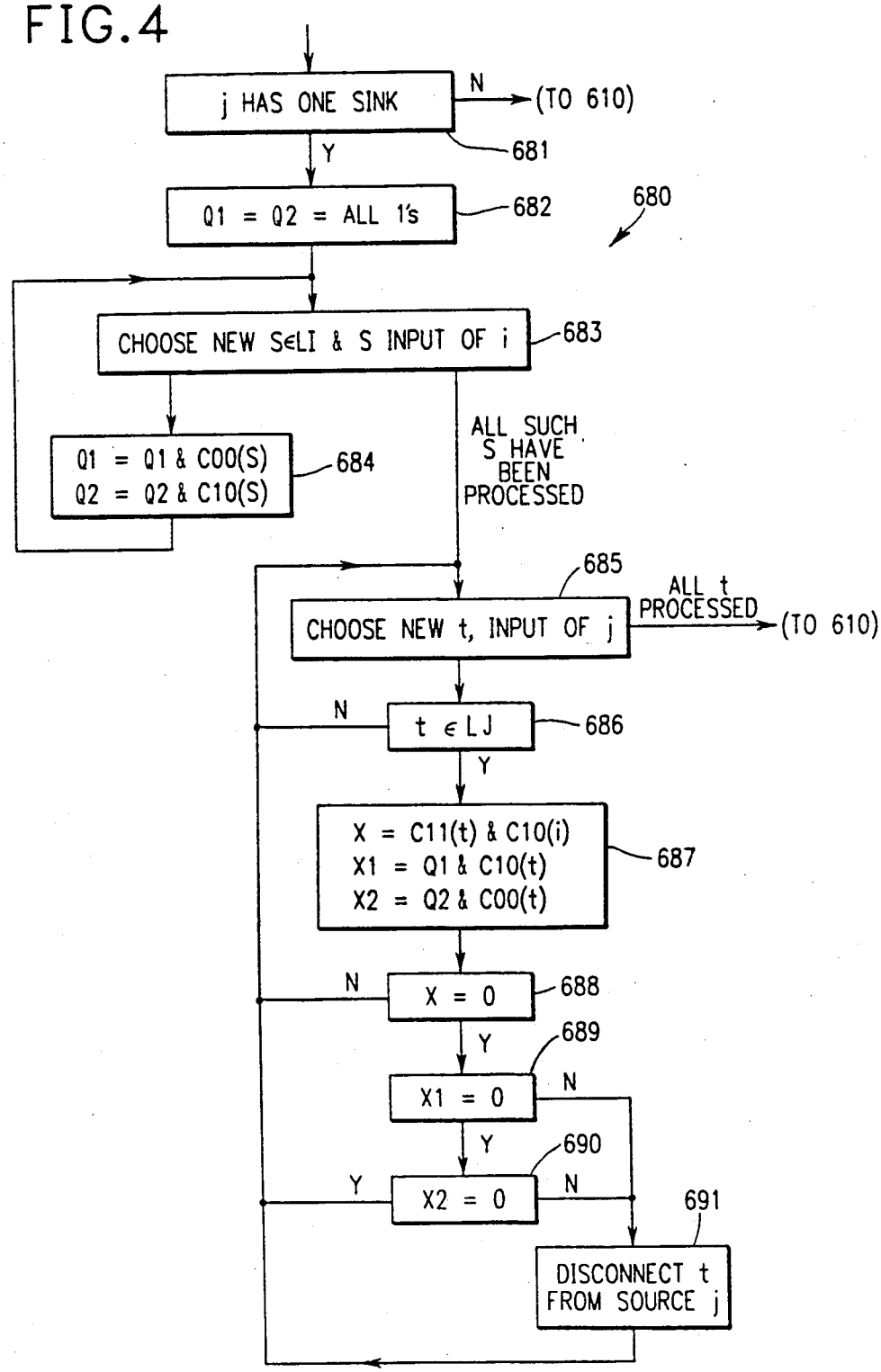
Figure 12:
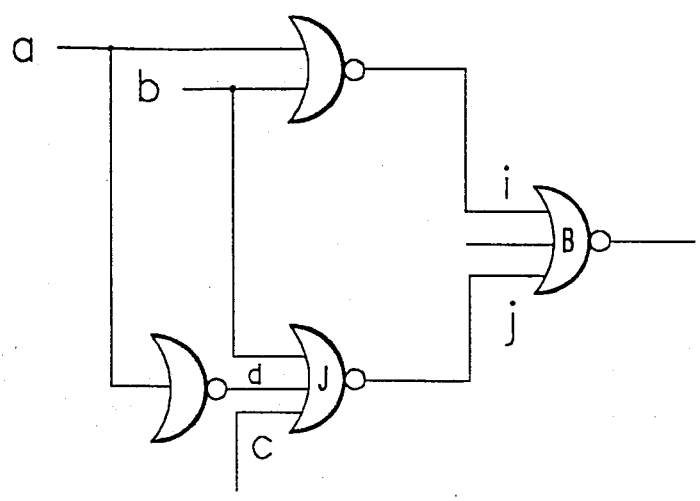

Example 4:

Refer to FIG. 12 which is the logic circuit under consideration, and FIGS. 3 and 4 for redundancy identities. The numbers in parenthesis indicate where the parameters are computed.

| (620) | C10(i) = a,b |
|---|---|
| (620) | C10(j) = b,c,d |
| (620) | Z1 = b; LI = a; LJ = c,d |
| (630) | C01(i) = null |
| (670) | C00(a) = a |
| (684) | C10(a) = null |
| (684) | Q1 = a; Q2 = null |
| (685) | t = d |
| (687) | C10(t) = a; C11(t) = d |
| (687) | X = (C11(t) and C10(i)) = 0 |
| (687) | X1 = (Q1 and C10(t)) = a |
| (689) | d at J is redundant |

Example 5:

Refer to FIG. 13 which is the logic circuit under consideration, and FIGS. 5 and 7 for redundancies and propagate constants routines. The numbers in parenthesis indicate where the parameters are computed.

| (708) | W0 = C11(t) = a |
|---|---|
| (708) | W1 = C01(t) = null |
|  | Propagate on s |
| (800) | Value (a) = 0 |
| (822) | Value (b) = 1 |
| (818) | Value (s) = 0 |
| (716) | S at B can be replaced by 0 |

Figure 14:
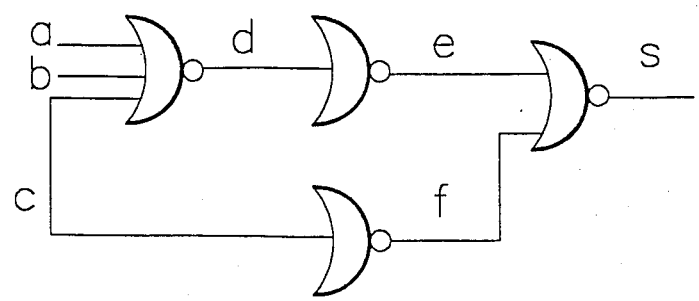

Example 6:

Refer to FIG. 14 which is the logic circuit under consideration, and FIG. 8 for the routine for controlling information propagation. The numbers in parenthesis indicate where the parameters are computed.

| (906) | C10(s) = a,b,c,e,f |
|---|---|
| (908) | C00(s) = c,s |
| (910) | C10(s) and C00(s) = c |
|  | s can be replaced by 0 |

Those skilled in the art will realize that the invention has been described by way of example making reference to but one preferred embodiment while describing or suggesting alternatives or modifications. Other alternatives and modifications will be apparent to those skilled in the art. Various hardware and software tradeoffs may be made in the practice of the invention without departing from the scope of the invention as defined in the appended claims. For example, the C(I,J) sets may be replaced by array representations.

Industrial Applicability

It is an object of the invention to remove redundant connections in a logic network.

It is another object of the invention to remove redundant connections in, and improve the testability of, a logic circuit.

It is yet another object of the invention to propagate global controlling information through a graphical representation of a logic network, and detect logically redundant connections by means of this information.

It is still another object of the invention to propagate global controlling information for each signal in a logic network and propagate the information through a graphical representation of the circuit. Redundancy identities are computed for, and constants are propagated for the signals. Logically redundant connections in the circuit are detected and removed as a result of the computations.

We claim:

1. A method of reducing the number of connections in a logic circuit comprised of a plurality of logic devices connected in a predetermined configuration, with each of said logic devices having at least one input signal s, said method comprising the steps of:

determining sets of relationships between said signal s of a given one of said logic devices and a set of other signals in said logic circuit;

making a set of assumptions based on the determined sets of relationships between said one input signals and said set of other signals;

searching said logic circuit dynamically to determine if there is a contradiction in said set of assumptions, wherein a found contradiction is a logical redundant connection;

repeating each of the above steps for each remaining input signal s of each logic device in said logic circuit, for determining each logical redundant connection in said logic circuit; and removing each determined logical redundant connection in said logic circuit, thereby reducing the number of connections in said logic circuit.

2. A method of reducing the number of connections in a logic circuit comprised of a plurality of logic devices connected in a predetermined configuration, with each of said logic devices having at least one input signal s, said method comprising the steps of:

determining sets of relationships between said signal s of a given one of said logic devices and a set of other signals in said logic circuit;

initializing controlling information relative to the determined sets of relationships;

making a set of assumptions based on the initialized controlling information relative to determined sets of relationships between said one input signal s and said set of other signals;

making a static determination of redundancy identities relative to the determined sets of relationships;

searching said logic circuit dynamically to determine if there is a contradiction in said set of assumptions, wherein a found contradiction is a logical redundant connection;

repeating each of the above steps for each remaining input signal s of each logic device in said logic circuit, for determining each logical redundant connection in said logic circuit; and removing each determined logical redundant connection in said logic circuit, thereby reducing the number of connections in said logic circuit.

3. A method of reducing the number of connections in a logic circuit comprised of a plurality of logic devices with there being a signals connected in said logic circuit, with each signal s being connected to at least one logic device, said method comprising the steps of:

(a) determining sets of relationships between each of said signals s and other signals in said logic circuit;

(b) choosing one of said signals s for processing;

(c) determining if said one signal s is the output of a logic device, if not go to step (d), if so compute controlling information on said one signal s based on the determined sets of relationships;

(d) determining if all the logic devices to which said one of the signal s is connected have been processed, if so return to step (b), if not choose one as the sink of said one signal s;

(e) determining if all of the signals connected to said sink of said one of the signal s have been processed, if not return to step (d), if so;

(f) determining redundancy identities as a function of the determined sets of relationships;

(g) making a set of assumptions based on the determined sets of relationships, including searching said logic circuit dynamically to determine if there is a contradiction in said set of assumptions, wherein a found contradiction is a logical redundant connection, and return to step (d) to process the next signal s, if all signals have been processed, all logical redundant connections have been found; and (h) removing each found logical redundant connection in said logic circuit, thereby reducing the number of connections in said logic circuit.

4. The method of claim 3, wherein the determined relationship between said one signal s and a set of other signals comprises four sets:

$C00(s)$—if any signal in this set is 0, then s must be 0.
   $C01(s)$—if any signal in this set is 0, then s must be 1.
   $C10(s)$—if any signal in this set is 1, then s must be 0.
   $C11(s)$—if any signal in this set is 1, then s must be 1.

5. The method of claim 4, wherein said initializing controlling information relative to the determined sets of relationships includes the steps of:

determining if the source of said one signal is a logic device, if so, choose a new signal for s, if not;

forming the following relationship between said four sets:

$C00(s) = -[s]-$
   $C11(s) = -[s]-$
   $C01(s) = C10(s) = \phi$ where $\phi$ means the set is empty or equal to zero.

* * * * *